United States Patent
Eder et al.

(10) Patent No.: US 7,303,940 B2
(45) Date of Patent: Dec. 4, 2007

(54) SEMICONDUCTOR COMPONENT HAVING AT LEAST ONE ORGANIC SEMICONDUCTOR LAYER AND METHOD FOR FABRICATING THE SAME

(75) Inventors: Florian Eder, Erlangen (DE); Marcus Halik, Erlangen (DE); Hagen Klauk, Erlangen (DE); Günter Schmid, Hemhofen (DE); Ute Zschieschang, Erlangen (DE)

(73) Assignee: Infineon Technologies AG, Munich (DE)

( * ) Notice: Subject to any disclaimer, the term of this patent is extended or adjusted under 35 U.S.C. 154(b) by 346 days.

(21) Appl. No.: 11/066,732

(22) Filed: Feb. 25, 2005

(65) Prior Publication Data

US 2005/0196972 A1 Sep. 8, 2005

(30) Foreign Application Priority Data

Feb. 27, 2004 (DE) ................ 10 2004 010 094

(51) Int. Cl.
*H01L 51/40* (2006.01)
*H01L 21/4763* (2006.01)
*H01L 51/00* (2006.01)
*H01L 23/58* (2006.01)

(52) U.S. Cl. .................. 438/99; 438/623; 257/40; 257/642; 257/759; 257/E21.299; 257/E51.007; 257/E51.049

(58) Field of Classification Search .......... 438/99, 438/82, 149; 257/40
See application file for complete search history.

(56) References Cited

U.S. PATENT DOCUMENTS 6,913,944 B2 * 7/2005 Hirai ..................... 438/99

| | | | |
|---|---|---|---|
| 2003/0032282 A1* | 2/2003 | M'Saad et al. | 438/680 |
| 2004/0209115 A1* | 10/2004 | Thompson et al. | 428/690 |
| 2005/0084788 A1* | 4/2005 | Yau et al. | 430/138 |
| 2005/0170643 A1* | 8/2005 | Fujii et al. | 438/637 |
| 2005/0179036 A1* | 8/2005 | Yamazaki et al. | 257/66 |
| 2006/0102893 A1* | 5/2006 | Gerlach et al. | 257/40 |

FOREIGN PATENT DOCUMENTS

WO  WO 2004/001855 A1  12/2003

OTHER PUBLICATIONS

Gundlach, D.J., et al., "Solvent-induced phase transition in thermally evaporated pentacene films," Applied Physics Letters, vol. 74, No. 22, May 31, 1999, American Institute of Physics, pp. 3302-3304.

Klauk, H., et al., "Pentacene organic transistors and ring oscillators on glass and on flexible polymeric substrates," Applied Physics Letters, vol. 82, No. 23, Jun. 9, 2003, American Institute of Physics, pp. 4175-4177.

(Continued)

*Primary Examiner*—Scott B. Geyer
*Assistant Examiner*—Seahvosh Nikmanesh
(74) *Attorney, Agent, or Firm*—Slater & Matsil, L.L.P.

(57) ABSTRACT

A semiconductor component has at least one organic semiconductor layer. The component also includes at least one protective layer for at least partially covering the at least one organic semiconductor layer to protect against environmental influences. The at least one protective layer contains a proportion of an alkane with $C_nH_{2n+1}$ and n greater than or equal to 15 or consists entirely of an alkane of this type, or of a mixture of alkanes of this type. In one example, the protective layer is a paraffin wax. This creates a high resistance to moisture.

22 Claims, 4 Drawing Sheets

OTHER PUBLICATIONS

Nowak, M.J., et al., "Dynamic mechanical spectroscopy of plastic crystalline states in *n*-alkane systems," Journal of Materials Science, No. 36, 2001, Kluwer Academic Publishers, pp. 4159-4166.

Sheraw, C.D., et al., "Organic thin-film transistor-driven polymer-dispersed liquid crystal displays on flexible polymeric substrates," Applied Physics Letters, vol. 80, No. 6, Feb. 11, 2002, American Institute of Physics, pp. 1088-1090.

* cited by examiner

SEMICONDUCTOR COMPONENT HAVING AT LEAST ONE ORGANIC SEMICONDUCTOR LAYER AND METHOD FOR FABRICATING THE SAME

This application claims priority to German Patent Application 102004010094.2, which was filed Feb. 27, 2004, and is incorporated herein by reference.

TECHNICAL FIELD

The invention relates to a semiconductor component having at least one organic semiconductor layer and to a method for fabricating the same.

BACKGROUND

A more or less long service life of the electric circuits, depending on the particular application, is required for electronic products based on organic field-effect transistors (OFETs) and circuits to be commercially viable.

The best circuit properties are achieved using bottom-contact architecture (see H. Klauk, M. Halik, U. Zschieschang, F. Eder, G. Schmid, and C. Dehm, "Pentacene organic transistors and ring oscillators on glass and on flexible polymeric substrates," Appl. Phys. Lett., vol. 82, p. 4175 (2003), which is incorporated herein by reference).

It has been found that transistor properties, for example of OFETs produced using bottom-contact architecture, are sensitive to moisture when various organic semiconductor compounds (e.g., pentacene, oligothiophenes, polythiophene derivatives) are used. This is based on the fact that in bottom-contact OFETs, the organic semiconductor layer is the last layer deposited (i.e., the top layer) and is therefore in direct contact with the environment, i.e., with atmospheric humidity.

The result of this is that water molecules, aided by the morphology of many organic semiconductor layers (for example pentacene as organic semiconductor does not form homogenous, amorphous layers, but rather forms microcrystallites, at the grain boundaries of which the layer thickness is only a few molecular layers) can get very close to or even penetrate into the charge carrier channel, where they can act as charge carrier traps and/or increase the free surface energy of the semiconductor/dielectric interface by their polar character.

Effects observed include, inter alia, a shift in the threshold voltage, a deterioration in the subthreshold swing, a reduction in the on/off ratio and an increase in the hysteresis of the transistors. These effects make it difficult to design integrated circuits based on organic transistors or make it altogether impossible to produce circuits that are able to function correctly.

The possible options for providing organic semiconductor layers with a protective layer that protects the semiconductor layers from environmental influences, in particular, moisture, are limited. The reason for this is the sensitivity of the organic semiconductor layers to organic solvents, from which suitable polymeric protective layers could be deposited, and the sensitivity of the organic semiconductor layers to thermal stresses, as occur during deposition of inorganic protective layers from the vapor phase, e.g., when using silicon oxide, silicon nitride, aluminum oxide.

There is a known variant for applying a polymeric protective layer to an organic semiconductor that has been developed in order to pattern organic semiconductor layers, i.e., to isolate individual transistors in integrated circuits from one another in order to avoid leakage currents between the transistors (see C. D. Sheraw, L. Zhou, J. R. Huang, D. J. Gundlach, T. N. Jackson, M. G. Kane, I. G. Hill, M. S. Hammond, J. Camps, B. K. Greening, J. Franc, and J. West, "Organic thin-film transistor-driven polymer-dispersed liquid crystal displays on flexible polymeric substrates," Appl. Phys. Lett. vol. 80, p. 1088 (2002), which is incorporated herein by reference). This photographically patternable polymer formulation is based on the polyvinyl alcohol/ammonium dichromate (PVA/ADC) system and is applied from a neutral aqueous solution. Most organic semiconductors tolerate this aqueous system on account of their strongly hydrophobic character, i.e., the organic transistors remain able to function after the treatment, which contrasts with the treatment using organic solvents (see D. J. Gundlach, T. N. Jackson, D. G. Schlorr, and S. F. Nelson, "Solvent-induced phase transition in thermally evaporated pentacene films," Appl. Phys. Lett., p. 3302 (1999), which is incorporated herein by reference).

After the treatment with this system, the same disadvantageous effects are observed (shift in the threshold voltage, deterioration in the subthreshold swing, reduction in the on/off ratio and increase in the hysteresis of the transistors) as occur under the action of moisture on a comparable, untreated substrate over the course of time.

SUMMARY OF THE INVENTION

The aspect of the invention provides an apparatus and a method that is highly resistant to moisture or with which a corresponding apparatus can be fabricated.

According to the preferred embodiment of the invention, this aspect is achieved by a semiconductor component having at least one protective layer for at least partially covering the at least one organic semiconductor layer to protect against environmental influences, the at least one protective layer containing a proportion of an alkane with $C_nH_{2n+1}$ and n greater than or equal to 15 or consisting entirely of an alkane of this type or of a mixture of alkanes of this type, in particular a paraffin wax.

Alkanes and paraffin wax are inexpensive and can be vaporized without decomposing even at relatively low temperatures. Therefore, a paraffin layer can be applied at low cost. The film of paraffin that has been deposited on the surface of the active organic layer (organic semiconductor layer) not only offers virtually one hundred percent protection against atmospheric humidity (diffusion barrier) but also provides protection against direct contact with water and all solvents that do not attack and/or diffuse through the paraffin layer, and therefore also allows subsequent processes to be carried out on the organic active layer protected in this way, for example subsequent patterning of the organic layer using the aqueous PVA/ADC system, without altering the original properties of the component.

In this context, it is advantageous if at least one protective layer is between 50 nm and 5 µm thick.

For further processing, it is advantageous if a polyvinyl alcohol layer is arranged on at least one protective layer as an etching mask.

In one advantageous configuration of the present invention, an organic field-effect transistor structure has at least one gate electrode layer, a gate dielectric layer, a source layer, a drain layer and an organic semiconducting layer.

It is advantageous for the organic semiconductor layer to include a proportion of pentacene, oligothiophene and/or a polythiophene or to include these substances or a mixture of these substances.

If the substrate is designed as a flexible material, an OFET may, for example, be arranged on or integrated in a film or paper.

In another embodiment, a method for manufacturing a semiconductor component is provided. The protective effect is achieved by at least one protective layer being applied at least to part of at least one organic semiconductor layer to protect against environmental influences, the at least one protective layer containing a proportion of an alkane with $C_nH_{2n+1}$ and n greater than or equal to 15 or consisting entirely of an alkane of this type or of a mixture of alkanes of this type, in particular a paraffin wax.

It is advantageous for at least one protective layer to be applied by vapor deposition. In this case, it is advantageous if the temperature is between 80 and 200° C. A temperature of between 120 and 150° C. is particularly advantageous. This temperature is above the operating limits that are customarily used but below the temperatures at which damage to the other layers is to be expected.

It is also advantageous if deposition is carried out in a vacuum vaporizer at a pressure of between $10^{-2}$ and $10^{-4}$ torr, particularly advantageously at a pressure of $10^{-3}$ torr.

To protect the layers located beneath the protective layer, it is advantageous if the layer or layers below it are cooled, in particular to a temperature of between 25 and 50° C.

It is also advantageous if, after the application or deposition of the at least one protective layer, a polyvinyl alcohol layer is arranged as an etching mask for further process steps.

BRIEF DESCRIPTION OF THE DRAWINGS

The invention is explained in more detail below with reference to the figures of the drawings and on the basis of a number of exemplary embodiments. In the drawings.

Figure 1:
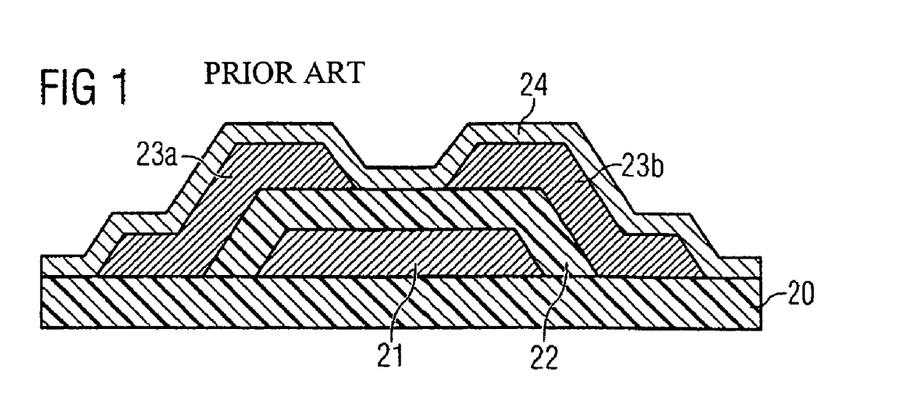
FIG. 1 shows a diagrammatic sectional view of a known organic field-effect

The following list of reference symbols can be used in conjunction with the figures 1 Protective paraffin layer
20 Base substrate for OFET
21 Gate electrode
22 Gate dielectric layer
23a Source layer
23b Drain layer
24 Organic semiconductor layer
25 PVA layer

DETAILED DESCRIPTION OF ILLUSTRATIVE EMBODIMENTS

Before going into exemplary embodiments of the apparatus according to the invention and the method according to the invention, the structure of an organic field-effect transistor, which is known, will be explained with reference to FIG. 1.

FIG. 1 shows a diagrammatic sectional view through an organic field-effect transistor (OFET).

Organic field-effect transistors are electronic components, which comprise a plurality of layers, which are patterned in order to generate integrated circuits by connections between individual layers. FIG. 1 shows the basic structure of a transistor of this type in bottom-contact architecture.

A gate electrode 21 is arranged on a base substrate 20 and is covered by a gate dielectric layer 22. Dielectrics of this type have a layer thickness of less than 5 nm (bottom up).

A source layer 23a and a drain layer 23b are arranged laterally with respect to the gate dielectric layer 22 and are both likewise connected to the active semiconducting layer 24 above. The organic semiconductor used in this case is pentacene.

With this bottom-contact architecture, the organic semiconductor layer 24 is arranged on the layer stack and is therefore exposed to environmental influences.

The method for fabricating this structure is known. The layers are successively deposited on the substrate 20.

Figure 2:
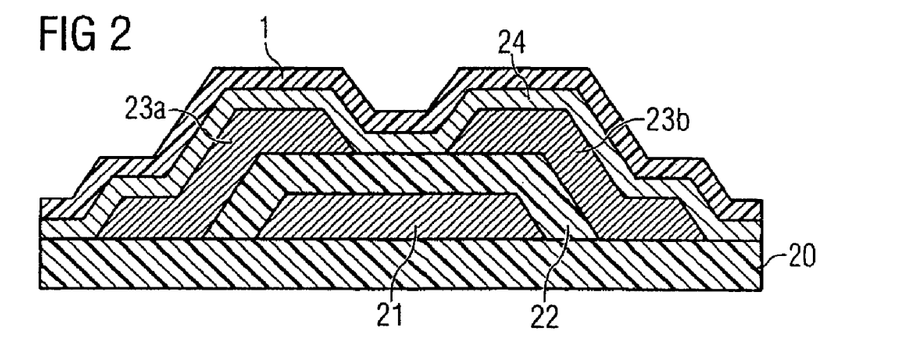
FIG. 2 shows a diagrammatic sectional view of an organic field-effect transistor with transistor.

FIG. 2 diagrammatically depicts the structure of an embodiment of a semiconductor component according to a first embodiment of the invention. The layer structure substantially corresponds to the structure of the semiconductor component shown in FIG. 1, and consequently reference is made to the description given above.

The embodiment of the invention relates to a layer for protecting the organic semiconductor layer 24 from moisture and for reducing fluctuations in parameters as occur during patterning of the organic semiconductor material in OFETs by means of PVA/ADC.

The sensitive organic semiconductor layer 24 is protected against moisture by being coated with a protective layer 1 of an alkane or an alkane mixture, e.g., paraffin wax.

In the preferred embodiment, the protective layer 1 is applied by vapor deposition, i.e., without the use of organic solvents, which could destroy the organic semiconductor layer 24. Moderate temperatures in vacuo (max. 200° C./$10^{-2}$ to $10^{-4}$ torr) are used.

If the organic semiconductor layer 24 is sensitive to the process temperatures, this can be avoided by corresponding cooling of the substrate 20 together with the layers 21, 22, 23a, 23b above it during deposition.

The term paraffins is to be understood as meaning long-chain, extremely hydrophobic alkanes, it being possible for the paraffins to comprise pure alkanes or alkane mixtures. Paraffins are commercially available in various chain lengths and therefore various melting ranges. Paraffins, which are solid at room temperature and have a melting range above the maximum temperature of use of the semiconductor components (e.g., approx. 80° C.), are preferred for the present invention.

Although paraffins include organic molecules (similarly to organic solvents, e.g., alcohols, acetone, hexane, petroleum ether), paraffin layers applied by vapor deposition do not cause any damage to the molecular arrangement of the active organic layers and therefore these layers retain their electrical properties.

This is attributable firstly to the size (length $\geq C_{15}$, in particular $\geq C_{17}$) of the alkanes and secondly to the state of aggregation of the paraffins (waxy to solid). Large molecules considerably inhibit diffusion through a layer or a crystal lattice compared to small organic solvent molecules, for steric reasons. Moreover, the paraffins are solid and therefore demobilized to a considerable extent.

The method described for the application of a protective layer 1 is in principle suitable for all organic semiconductor components on rigid or flexible substrates 20 in which the organic semiconductor layer 24 (active layer) reacts sensitively to moisture in any way.

The text that follows gives a number of examples of embodiments of the invention.

EXAMPLE 1

Application of a Protective Paraffin Layer from the Vapor Phase

A freshly produced semiconductor component (transistors and integrated circuits based on organic semiconductors on any desired substrates), in which an organic semiconductor layer 24 (e.g., pentacene) was deposited in the last process step (see for example, FIG. 1) is introduced into a vacuum vaporizer with substrate cooling. The temperature of the substrate holder is controlled to 25-50° C. (preferably 25° C.). Depending on the substrate size, the vaporizer source is loaded with a maximum of 1 g of paraffin wax (solidification point 73-80° C.—Aldrich) and then evacuated. The source is heated at a pressure of $10^{-2}$ to $10^{-4}$ torr (preferably $10^{-3}$ torr). The paraffin sublimes at a temperature of at most 200° C. (preferably 120 to 150° C.) and is deposited as a protective layer 1 on the cooled substrate. The layer thickness of the protective layer 1 can be set by means of the duration of vaporization (preferably 50 nm to 5 μm).

EXAMPLE 2

Subsequent Processes Carried Out on the Protective Paraffin Layer (Patterning of the Organic Semiconductor Layer)

Figure 3:
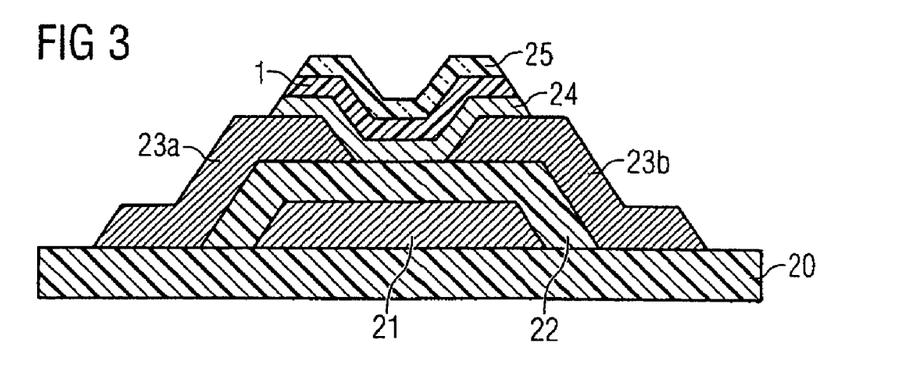
FIG. 3 shows a diagrammatic sectional view of an organic field-effect transistor with a protective layer and a PVA layer.

A semiconductor component is provided with a protective layer 1 of paraffin in the same way as in Example 1. Then, an aqueous PVA/ADC formulation (see the article by Sheraw et al., cited above and incorporated herein by reference) is spun on (see FIG. 3, PVA layer 25), exposed using a photomask and developed in water. Then, the paraffin layer and the organic semiconductor layer 24 are etched in an oxygen plasma, with the UV-cured PVA layer 25 serving as an etching mask. Alternatively, the PVA etching mask can be printed onto the paraffin layer and cured by floodlight exposure.

EXAMPLE 3

Reducing the Influence of Moisture on the Subthreshold Swing and the On/Off Ratio The effect of the exemplary embodiments according to the invention is demonstrated on the basis of measured values.

Figure 4A:
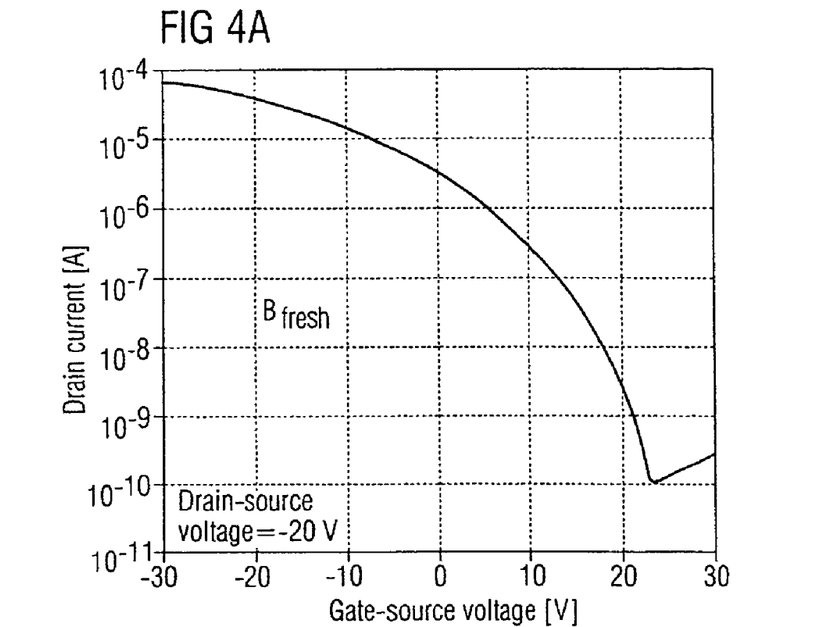
FIGS. 4A-4C illustrate measured values relating to Example 3.
Figure 4B:
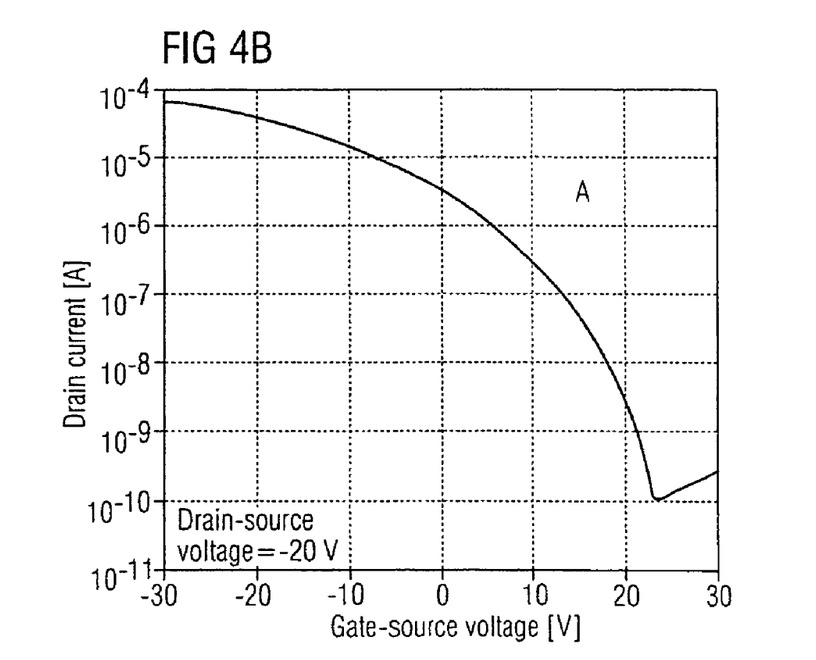
Figure 4C:
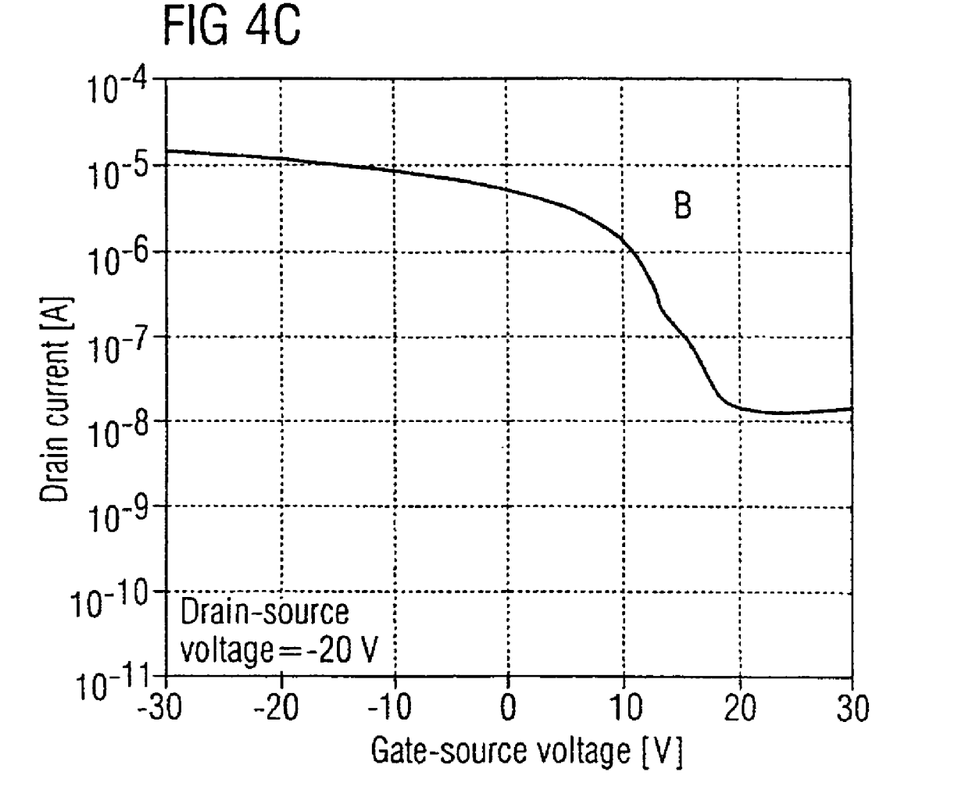

Two substrates (of which substrate A was coated with a protective layer 1 comprising paraffin as described in Example 1 and substrate B was left untreated) were stored for 10 days under 75% atmospheric humidity. The substrates were measured electrically before (e.g., FIG. 4A for $B_{fresh}$) and after storage (FIG. 4B for A and FIG. 4C for B). The drain current is in each case plotted against the gate-source voltage for a given drain-source voltage. The subthreshold swing and the on/off ratio of the transistors can be determined from this curve. Whereas, with substrate B a considerable deterioration was observed as a result of the action of moisture, the characteristic curve of substrate A remained virtually unchanged.

EXAMPLE 4

Figure 5:
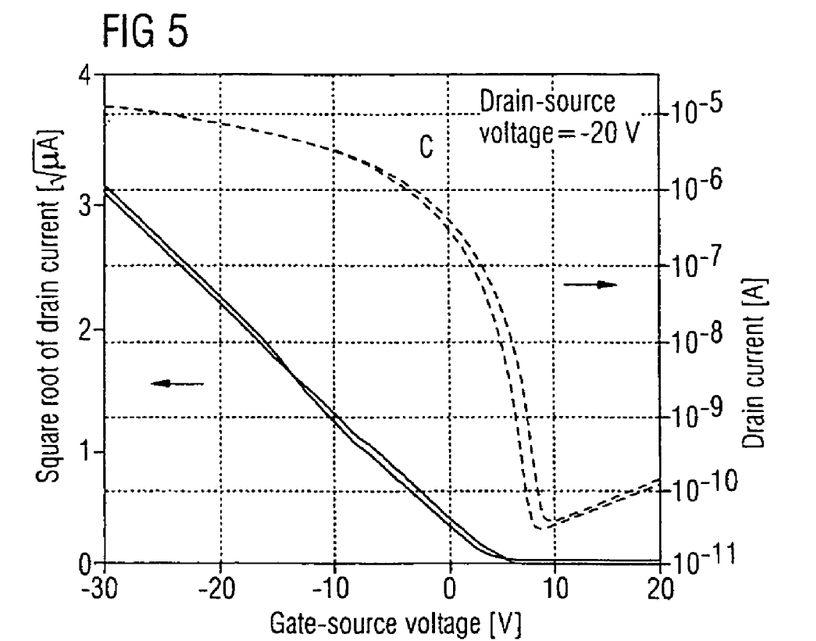
FIGS. 5-6 illustrate measured values relating to Example 4.
Figure 6:
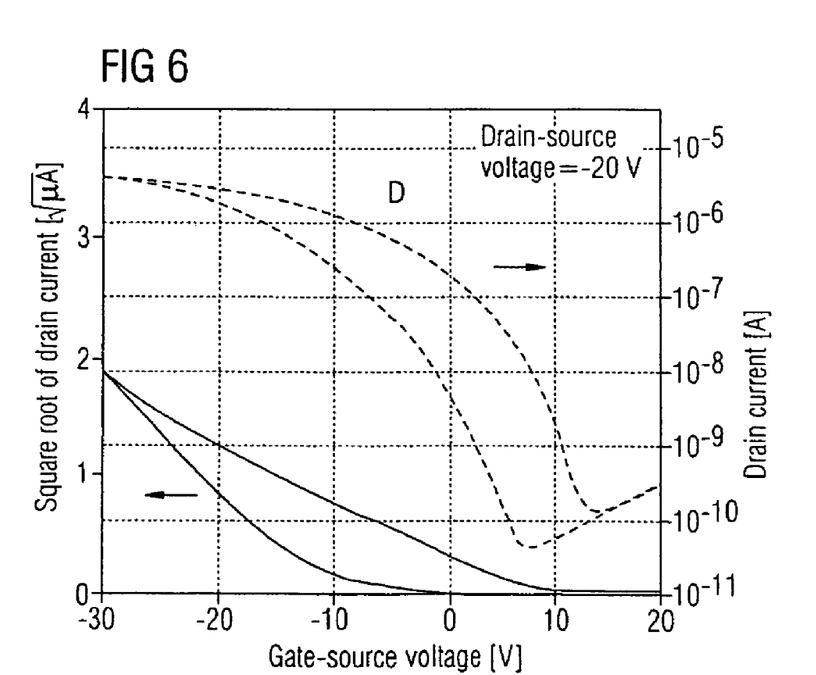

Reduction of the Hysteresis in OFET after Patterning of the Organic Semiconductor by Means of PVA/ADC through Introduction of a Protective Paraffin Layer The hysteresis of pentacene OFETs before and after patterning of the pentacene layer was determined for two substrates C and D. Substrate C had been provided with a protective paraffin layer 1 (see Example 1), whereas in the case of substrate D, the patterning was carried out directly on the pentacene layer 24. Prior to patterning, both substrates were virtually hysteresis-free (approx. 1 V, see FIG. 5).

Substrate C, even after the patterning with the aqueous PVA/ADC formulation, has a hysteresis of approx. 1 V. In the case of substrate D (without the paraffin layer), the hysteresis rises to approx. 11 V.

The execution of the invention is not restricted to the preferred exemplary embodiments given above. Rather, a number of variants are conceivable, making use of the semiconductor component according to the invention and the method for fabricating it for fundamentally different types of design as well.

What is claimed is:

1. A semiconductor component comprising:
   at least one organic semiconductor layer;
   at least one protective layer for at least partially covering the at least one organic semiconductor layer, the at least one protective layer containing a proportion of an alkane with $C_nH_{2n+1}$ and n greater than or equal to 15.

2. The semiconductor component as claimed in claim 1, wherein the protective layer comprises an alkane with $C_nH_{2n+1}$.

3. The semiconductor component as claimed in claim 1, wherein the protective layer comprises a mixture of alkanes with $C_nH_{2n+1}$.

4. The semiconductor component as claimed in claim 1, wherein the protective layer comprises a paraffin wax.

5. The semiconductor component as claimed in claim 1, wherein the at least one protective layer is between 50 nm and 5 μm thick.

6. The semiconductor component as claimed in claim 1, wherein a polyvinyl alcohol layer is arranged over the at least one protective layer.

7. The semiconductor component as claimed in claim 1, wherein the component includes an organic field-effect transistor structure comprising: at least one gate electrode layer;
   a gate dielectric layer adjacent the gate electrode layer;
   a source layer adjacent the gate electrode layer;
   a drain layer adjacent the gate electrode layer; and
   an organic semiconductor layer adjacent the gate electrode layer.

8. The semiconductor component as claimed in claim 1, wherein the organic semiconductor layer includes a proportion of pentacene, oligothiophene and/or a polythiophene.

9. The semiconductor component as claimed in claim 1, wherein the substrate comprises a flexible material.

10. A method for fabricating a semiconductor component, the method comprising:
    forming a component having at least one organic semiconductor layer; and
    applying at least one protective layer over at least part of at least one organic semiconductor layer, the at least one protective layer containing a proportion of an alkane with $C_nH_{2n+1}$ and n greater than or equal to 15.

11. The semiconductor component as claimed in claim 10, wherein the protective layer comprises an alkane with $C_nH_{2n+1}$.

12. The semiconductor component as claimed in claim 10, wherein the protective layer comprises a mixture of alkanes with $C_nH_{2n+1}$.

13. The semiconductor component as claimed in claim 10, wherein the protective layer comprises a paraffin wax.

14. The method as claimed in claim 10, wherein at least one protective layer is applied by vapor deposition.

15. The method as claimed in claim 14, wherein at least one protective layer is deposited from vapor phase at a temperature of between about 80 and about 200°C.

16. The method as claimed in claim 15, wherein at least one protective layer is deposited at a temperature of between about 120 and about 150°C.

17. The method as claimed in claim 14, wherein at least one protective layer is deposited in a vacuum vaporizer at a pressure of between about $10^{-2}$ and about $10^{-4}$ torr.

18. The method as claimed in claim 17, wherein at least one protective layer is deposited in a vacuum vaporizer at a pressure of about $10^{-3}$ torr.

19. The method as claimed in claim 10, wherein, while the protective layer is being applied, the component below the protective layer is cooled.

20. The method as claimed in claim 19, wherein the component is cooled to a temperature of between 25 and 50°C.

21. The method as claimed in claim 10, and further comprising, after applying the at least one protective layer, forming a polyvinyl alcohol layer over the at least one protective layer.

22. The method as claimed in claim 21, and further comprising using the polyvinyl alcohol layer as an etching mask.

* * * * *

UNITED STATES PATENT AND TRADEMARK OFFICE
CERTIFICATE OF CORRECTION

PATENT NO. : 7,303,940 B2
APPLICATION NO. : 11/066732
DATED : December 4, 2007
INVENTOR(S) : Eder et al.

It is certified that error appears in the above-identified patent and that said Letters Patent is hereby corrected as shown below:

In Col. 3, line 37, insert --transistor;-- after field-effect.
In Col. 3, line 39, delete "transistor" and insert --a protective layer--. (second occurrence)
In Col. 6, line 32, delete "$C_nH_{2+1}$" and insert --$C_nH_{2n+1}$--.
In Col. 7, line 14, insert --a-- after from.

Signed and Sealed this

Fifteenth Day of April, 2008

JON W. DUDAS
*Director of the United States Patent and Trademark Office*